United States Patent [19]
Kayser et al.

[11] Patent Number: 5,247,240
[45] Date of Patent: Sep. 21, 1993

[54] MINIATURIZED SWITCHING POWER SUPPLY WITH CIRCUIT FOR UNIDIRECTIONAL SUPPRESSION OF LEADING SPIKE

[75] Inventors: Kenneth W. Kayser, St. Charles, Ill.; Joel C. Van Antwerp, Bullard, Tex.

[73] Assignee: Power Trends, Batavia, Ill.

[21] Appl. No.: 557,937

[22] Filed: Jul. 25, 1990

[51] Int. Cl.$^5$ .............................................. G05F 1/569
[52] U.S. Cl. .................................... 323/288; 363/21; 363/56
[58] Field of Search ............... 363/21, 97; 323/288; 307/520

[56] References Cited
U.S. PATENT DOCUMENTS

| 4,562,523 | 12/1985 | Rodel et al. | 363/21 |
| 4,866,588 | 9/1989 | Rene | 363/21 |
| 4,928,220 | 5/1990 | White | 363/56 |
| 4,929,883 | 5/1990 | Chieli | 323/282 |
| 4,943,902 | 7/1990 | Severinsky | 363/80 |
| 4,985,818 | 1/1991 | Niederreiter | 363/21 |

FOREIGN PATENT DOCUMENTS

| 287166 | 10/1988 | European Pat. Off. | 363/21 |
| 293165 | 12/1986 | Japan . | |

*Primary Examiner*—William H. Beha, Jr.
*Attorney, Agent, or Firm*—Hill, Steadman & Simpson

[57] ABSTRACT

A high frequency miniaturized switching power supply has a unidirectional spike filter which removes spikes appearing on a feedback signal before such feedback signal is provided to the comparator of the switching power supply. The spike filter removes voltage spikes of one polarity without lengthening the reset time of the comparator in response to a wavefront of the opposite polarity.

2 Claims, 1 Drawing Sheet

MINIATURIZED SWITCHING POWER SUPPLY WITH CIRCUIT FOR UNIDIRECTIONAL SUPPRESSION OF LEADING SPIKE

BACKGROUND OF THE INVENTION

The present invention relates to a miniaturized switching power supply, and more particularly to one having a comparator with an improved input circuit incorporating a unidirectional spike filter.

A major difficulty in the miniaturization of the switching power supply is the need to use relatively large components which allow operation at relatively low frequencies. While it has been recognized that operation at higher frequencies would allow reduction of the size of certain components, the effect of the inductance of printed circuit traces introduces noise which interferes with proper operation at high frequencies. It is desirable to reduce the size of the switching power supply to approximately the size and shape of a standard IC, so that little circuit board space is required, and connection of the switching power supply is made readily by means of terminals or pins, by use of conventional assembly equipment. Reducing the size of switching power supplies to this level requires operation at much higher frequencies, but high frequency operation has not been practical with existing designs.

In conventional miniaturized switching power supplies, the inductance of printed circuit board traces and other components making up the circuit produces ringing type noise signals which degrade operation. The presence of these inductances, along with distributed capacitances throughout the circuit, cause extraneous spikes which result in noisy operation in terms of the voltage levels to be expected at any given time. This interferes with proper operation, since the voltage level must be sensed correctly in order to allow proper regulation of the output of the unit. The occurrence of a spike voltage represents an uncertainty in the true voltage level at any given time, and contributes to imprecise operation of the circuit.

As a result of these difficulties, prior switching power supplies had to confine their operation to frequency levels at which the stray inductances would not contribute more than a minimal amount of undesirable spikes which are filterable by a simple PC network. However, this limits the minimum size which can be achieved in miniaturization. In order to achieve a miniaturized switching power supply which is less than this limit, it is necessary to operate at very high frequencies in the region of one megahertz, and at these frequencies the presence of spikes and noisy operating conditions render known forms of switching power supplies generally unusable.

Accordingly, it is desirable to provide an apparatus in which spikes are eliminated, even at very high frequency operation, especially at the input of the comparator of a switching power supply, without degrading the underlying signal.

Another object of the present invention is to provide such a filter capable of operating at high frequencies, and which does not delay or impede operation of the comparator at high frequencies.

SUMMARY OF THE PRESENT INVENTION

It is a principal object of the present invention to provide a spike filter which eliminates spikes which would otherwise tend to interfere with proper operation of a miniaturized switching power supply.

In one embodiment of the present invention, there is provided a miniaturized switching power supply having a comparator, with a unidirectional filter connected to the input of the comparator, which functions to limit spikes in a positive direction without delying resetting of the comparator.

These and other objects and advantages of the present invention will become manifest by a review of the following description in the accompanying drawings.

BRIEF DESCRIPTION OF THE DRAWINGS

Reference will now be made to the accompanying drawings, in which.

DESCRIPTION OF THE PREFERRED EMBODIMENT

Figure 1:
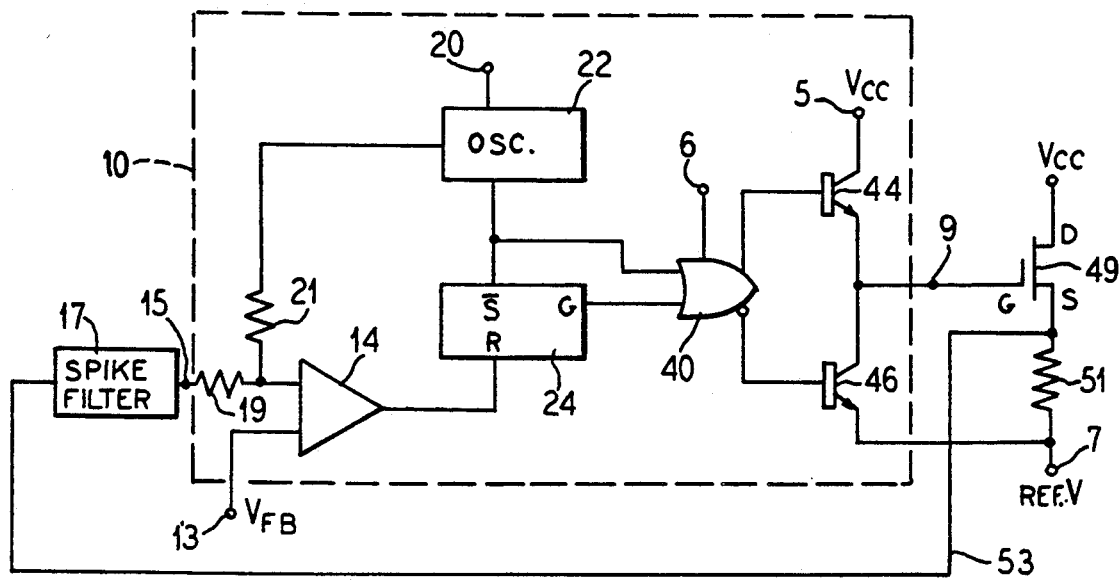
FIG. 1 is a functional block diagram of a switching power supply control section incorporating an illustrative embodiment of the invention.

Reference will now be made to FIG. 1, which illustrates a diagram of a miniaturized switching power supply. The power supply is embodied as an integrated circuit 10, having a number of pins or terminals for access to circuits outside the IC. A source of feedback voltage is connected to a pin 13 and thence to one input of a comparator 14, and the other input of the comparator 14 is connected to pin 15, and receives a positive feedback voltage through a spike filter 17 and a resistor 19. Positive feedback voltage is developed from a sensing unit which senses the output voltage of the power supply as compared to a desired reference voltage. As shown in FIG. 1, a resistor 51 is connected in series with the drain-source current path of an N-channel FET 49. The voltage developed across the resistor 51 is connected by a line 53 to the input of the spike filter 17, which smoothes the feedback signal. Another current feedback circuit may be used in place of the resistor 51. An RS flip-flop 24 is provided which has its reset input connected to the comparator 14 and its set input connected to the output of an oscillator 22, which has a control input connected to a pin 20. The oscillator 22 provides setting signals to the flip-flop 24, and a ramp signal which is added to the current feedback signal, through a resistor 21, which forms a summing network with the resistor 19. The duty cycle of the flip-flop 24, as well as the pulse repetition rate of output pulses from its output, are dependent on the frequency of operation of the oscillator 22, as well as operation of the comparator 14.

The output of the flip-flop 24 is connected to one input of an OR gate 40, which has another input connected to the output of the oscillator 22. It receives power from $V_{cc}$ at pin 6.

The OR gate 40 provides two inverse outputs, i.e. true, and inverted outputs, which are connected to the bases of two series-connected transistors 44 and 46, and pin 9 is connected to a point between the two transistors 44 and 46. Pin 9 supplies the gate voltage to the FET 49 which operates as the power controlling unit.

Figure 2:
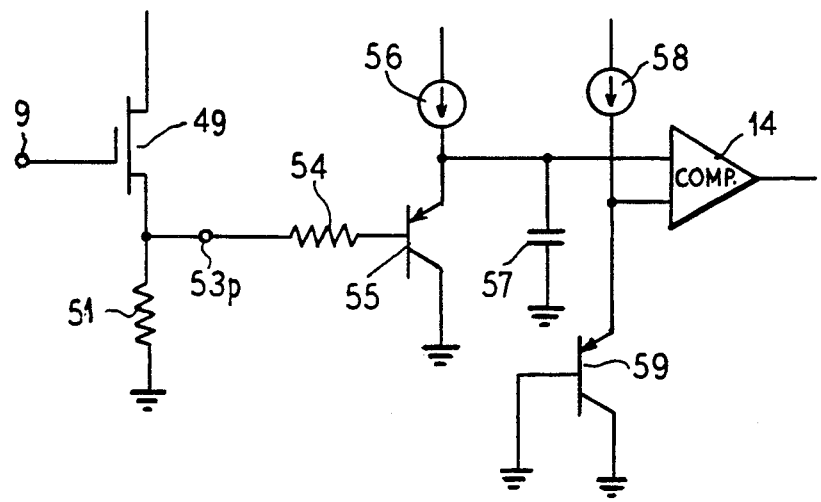
FIG. 2 is a schematic diagram of a circuit incorporating an illustrative embodiment of the present invention.

The details, of the spike filter 17 and comparator 14 of FIG. 1 are shown in FIG. 2, which constitutes a schematic diagram of an illustrative embodiment of the present invention, with a spike filter incorporated in the IC 10. In FIG. 2, the FET 49 is shown along with the current feedback resistor 51. The voltage feedback from the current feedback resistor 51 is connected to a pin 53P of the IC 10, and the pin 53P is connected through a resistor 54 to the base of a PNP transistor 55. The collector of the transistor 55 is grounded, and its emitter is connected to the output of a current source 56, to ground through a capacitor 57, and to one input of the comparator 14. The other input of the comparator is connected to the voltage reference input unit 13 (FIG. 1), to the emitter of a PNP transistor 59, which functions with a current source 58, and which has its collector and base connected to ground, to establish a fixed threshold voltage level.

Figure 3A:
FIGS. 3A and 3B are waveforms illustrating the operation of the prior art, and the operation of the apparatus of FIG. 2, respectively.

In operation, spikes which may appear in the voltage feedback applied to the pin 53P and interfere with proper operation of the circuit. A waveform of a typical input signal applied to pin 53P is illustrated in FIG. 3A, showing the occurrence of a large ringing spike, during the early part of a rising waveform. The voltage level represented by the spike actually exceeds the maximum voltage of the rising waveform, which results in improper operation of the comparator, which is intended to detect when the rising waveform passes a specific threshold level. As shown in FIG. 3A, the entire ramp waveform is exceeded by the noise peak, so that improper operation would result.

Figure 3B:

On the contrary, FIG. 3B illustrates the output signal applied to the comparator resulting from use of the present invention. As illustrated in FIG. 3B, the noise spike is substantially reduced, so that operation of the comparator 14, which depends on the instantaneous level of the voltage waveform, is not degraded.

The spike is effectively removed by the apparatus of FIG. 2 by the capacitor 57 in conjunction with the current sources 56 and 58.

The current source 56 establishes the maximum rate at which the capacitor 57 may be charged, as long as the feedback voltage exceeds the level at which the PNP transistor 55 is cut off. This charge current rate is chosen in conjunction with the value of the capacitor 57 to achieve the maximum slew rate at which the comparator 14 must be furnished in order to operate reliably at any high frequency at which the switching power supply operates. Frequencies up to at least 1.5 MHz are feasible with the present invention.

The voltage drop across the b-e junctions of the transistors 55 and 59 are equal, allowing both inputs of the comparator 14 to be displaced above the threshold voltage by the same amount, allowing comparator switching right at the threshold voltage.

With the assurance that spikes do not occur at the input waveforms of the comparator 14, the switching power supply can be operated at very high frequencies, which require extremely fast rates of rise of the signals such as those illustrated in FIG. 3B. The transistor 55, operating in conjunction with the current source, 56, functions to rapidly discharge the capacitor 57 during periods in which a low voltage level is applied to the pin 53. The capacitor 57 is therefore discharged extremely rapidly, in response to descending waveforms. As a result, while spikes are effectively limited during the rising portion of the waveform of FIG. 3B, this does not interfere with the operation of the circuit in achieving the rapidly falling trailing waveform, as shown in FIG. 3B.

This rapid falling waveform is essential to rapid resetting operation of the comparator of a miniaturized switching power supply, since the comparator needs 50 to 100 nanoseconds to get back into equilibrium so that a subsequent cycle of the waveform of FIG. 3A can be handled reliably, i.e., the comparator triggers at the same point of the waveform. The voltage at the comparator input must be stable for a period of time, so that the comparator can function properly.

The rapid falling waveform achieved by the present invention allows the comparator to be off for approximately 100 nanoseconds, which operation at 1-2 MHz to allow a safety factor after the time required to reach equilibrium. As long as equilibrium is assured for the comparator, its operation is reliable and the circuit performs efficiently. In contrast to this operation, in previous switching power supplies not incorporating the spike filter of the present invention, a comparator must be off for approximately 300 nanoseconds before it can furnish a reliable output.

It is apparent that various modifications and additions may be made in the apparatus of the present invention without departing from the essential features of novelty thereof, which are intended to be defined and secured by the appended claims.

What is claimed is:

1. A miniaturized switching power supply having a comparator, means connected to the output of the comparator and responsive to the operation thereof for controlling the output of the power supply, means connected to the output of the power supply for producing a feedback voltage, and means interposed between the source of said feedback voltage and the input of said comparator for limiting the rate at which a voltage supplied to said comparator may rise, without limiting the rate at which said voltage may fall.

2. A miniaturized switching power supply having a comparator, means connected to the output of the comparator and responsive to the operation thereof for controlling the output of the power supply, means connected to the output of the power supply for producing a feedback voltage, and spike filter means interposed between the source of said feedback voltage and the input of said comparator for limiting the rate at which a voltage supplied to said comparator may rise, without limiting the rate at which said voltage may fall, said comparator comprising an operational amplifier, first and second current sources connected to two inputs of said operational amplifier, said spike filter means comprising an input transistor, said input transistor being connected in series with a current source connected to said one input of said comparator, and a capacitor connected between said one input of said comparator and ground, whereby said capacitor may be charged in one direction by said current source and discharged at a more rapid rate in the other direction by said transistor.

* * * * *